United States Patent [19]
Doan

[11] Patent Number: 5,223,081
[45] Date of Patent: Jun. 29, 1993

[54] METHOD FOR ROUGHENING A SILICON OR POLYSILICON SURFACE FOR A SEMICONDUCTOR SUBSTRATE

[76] Inventor: Trung T. Doan, 1574 Shenandoan Dr., Boise, Id. 83712

[21] Appl. No.: 725,357

[22] Filed: Jul. 3, 1991

[51] Int. Cl.$^5$ ............................................. H01L 21/00
[52] U.S. Cl. ...................................... 156/628; 156/656; 156/657; 156/662; 437/228; 437/200
[58] Field of Search ............... 156/628, 656, 657, 662; 427/383.1, 383.3, 123, 96, 58; 437/228, 245, 247

[56] References Cited

U.S. PATENT DOCUMENTS

| | | | |
|---|---|---|---|
| 3,615,948 | 10/1971 | Krostewitz | 156/628 X |
| 4,147,564 | 4/1979 | Magee et al. | 156/628 X |
| 4,294,651 | 10/1981 | Ohmura | 356/662 |
| 4,663,188 | 5/1987 | Kane | 427/74 |
| 4,917,752 | 4/1990 | Jensen et al. | 156/292 |

FOREIGN PATENT DOCUMENTS 62-61345  3/1987  Japan .................................. 156/628

Primary Examiner—Thi Dang

[57] ABSTRACT

This invention relates to a method for roughening a silicon or polysilicon substrate of a semiconductor. The method includes the steps of: depositing a metal layer onto the substrate, heating the metal layer and substrate through to form a metal silicide on the substrate by reaction of the metal layer and substrate, and removing the metal silicide and a metal oxide by selective etching to expose the roughened surface. The actual etching process may be a two-step procedure. A first etch uses ammonium hydroxide and hydrogen peroxide to remove the oxide layer formed with the silicide. A second etch uses hydrofluoric acid to remove the silicide.

13 Claims, 2 Drawing Sheets

METHOD FOR ROUGHENING A SILICON OR POLYSILICON SURFACE FOR A SEMICONDUCTOR SUBSTRATE

FIELD OF THE INVENTION

This invention relates to a method for roughening a silicon or polysilicon surface of a semiconductor by deposition of a metal that reacts with silicon to form a silicide and then acid etching the silicide to expose a roughened silicon surface.

BACKGROUND OF THE INVENTION

As silicon technology advances to ultra-large scale integration (ULSI), the devices on silicon wafers shrink to sub-micron dimension and the circuit density increases to several million transistors per die. In order to accomplish this high device packing density, smaller and smaller feature sizes are required. This may include the width and spacing of interconnecting lines and the surface geometry such as corners and edges, of various features.

One manufacturing technique for improving the circuit density on a silicon semiconductor die involves roughening a surface of the semiconductor wafer during manufacture thereof. There are various reasons for providing a roughened surface on a semiconductor wafer or die. Some examples are: (1) to provide additional surface area within the confines of a given volume, i.e., to increase the capacitance of a DRAM storage cell; (2) to provide better adhesion for adjacent or connecting insulators or conductors; (3) to reduce reflective notching in the photolithography process, due to the reabsorption of incident light by adjacent surface irregularities; and (4) to improve the efficiency of solar cells by providing a light entry surface having surface irregularities for absorbing the incident light.

In the past, roughening of the semiconductor surface has been accomplished by mechanical abrasion or sanding. Mechanical roughening is typically a messy procedure which may introduce contaminants into the manufacturing process. The presence of particulate contaminants may, for example, produce patterning errors during a photopatterning process.

An exemplary mechanical process for roughening a semiconductor surface is disclosed in U.S. Pat. No. 4,917,752 to Jensen. The method disclosed in Jensen involves "lapping" the back side of a silicon sphere to provide a roughened surface for better adhesion to an aluminum foil. The aluminum foil is then preheated and impact pressed to the roughened sphere.

Other prior art patents have disclosed methods of roughening a semiconductor surface without mechanical abrasion. An example of a method for treating a semiconductor substrate to provide a roughened surface, without mechanical abrasion, is disclosed in U.S. Pat. No. 4,294,651 to Ohmura. In Ohmura, the back side of a substrate is etched with a mixture of a fluorine compound, an oxidizing agent, and an alkali to produce a roughened surface. If an even rougher surface is desired, the substrate is pre-etched with a mixture of a fluorine compound and a manganese-containing oxidizing agent. In this case, the purpose of the roughening is to promote adhesion to an adjacent metal layer.

A problem with such prior art processes is that the chemical etchants used and the etching technique may degrade the electrical characteristics of the semiconductor devices formed on the silicon substrate. Additionally, the process steps may be difficult to accurately control in a manufacturing environment.

A third patent, U.S. Pat. No. 4,663,188 to Kane, discloses a process of depositing a light transmissive electrical contact, i.e., $SnO_2$, having a textured surface, on top of a clear substrate to form a photo detector electrical contact. The roughened or textured surface is accomplished by a chemical vapor deposition process. The technique disclosed in Kane is not applicable to most semiconductor manufacturing process.

The present invention is directed to a method for roughening a silicon or polysilicon semiconductor surface in which there is no mechanical abrasion of the surface. The method of the invention contemplates the use of chemical etchants and techniques that are compatible with manufacturing operations and that do not degrade the electrical characteristics of the finished semiconductor devices.

SUMMARY OF THE INVENTION

In accordance with the present invention, a novel method of roughening and increasing the surface area of a silicon or polysilicon substrate of a semiconductor is provided. The method of the invention generally stated comprises the steps of:

forming a thin layer of a metal such as titanium over a substrate, which may be polysilicon or silicon;

heating the substrate and metal layer to a temperature sufficient for causing a chemical reaction between the metal layer and surface of the substrate for forming a silicide layer on the substrate and a thin layer of a metal oxide-nitride on the silicide layer;

removing the metal oxide-nitride layer; and then selectively etching the silicide layer with an etchant to expose the roughened polysilicon/silicon substrate.

Roughness is created on the substrate surface due to the presence of native polysilicon/silicon oxide on the substrate. This native oxide causes the metal to react unevenly with the polysilicon/silicon substrate during heating which results in a rough silicide layer on the substrate. This rough surface is formed predominately at the grain boundary of the metal layer with the polysilicon/silicon surface of the substrate. Removal of the metal oxide layer exposes the roughened silicide layer. This roughened silicide layer may then be removed by the selective etchant to expose the roughened silicon/polysilicon surface of the substrate.

The method of the invention avoids the possibility of particulate contamination of the semiconductor that can occur when using a mechanical abrasion or lapping process, as in the prior art. Moreover, the etchant process of the invention can be closely controlled and the chemicals selected to achieve a roughened surface having electrical properties suitable for formation of high quality semiconductor devices on the substrate.

In an illustrative embodiment of the invention, a metal used for forming the metal layer is titanium. The metal oxide-nitride layer formed by the heating of the titanium layer and substrate is removed with a solution such as ammonium hydroxide and hydrogen peroxide. For removing the silicide layer, a selective etchant such as hydrofluoric acid may be used.

Other objects, advantages, and capabilities of the present invention will become more apparent as the description proceeds.

DETAILED DESCRIPTION OF THE INVENTION

In the manufacture of integrated circuits (Ics), various materials are utilized which are electrically either conductive, insulating, or semiconducting, although the completed semiconductor circuit device itself is usually referred to as a "semiconductor". One of the materials used is silicon, which is used as either single crystal silicon or as polycrystalline silicon material referred to herein as polysilicon.

Figure 1:
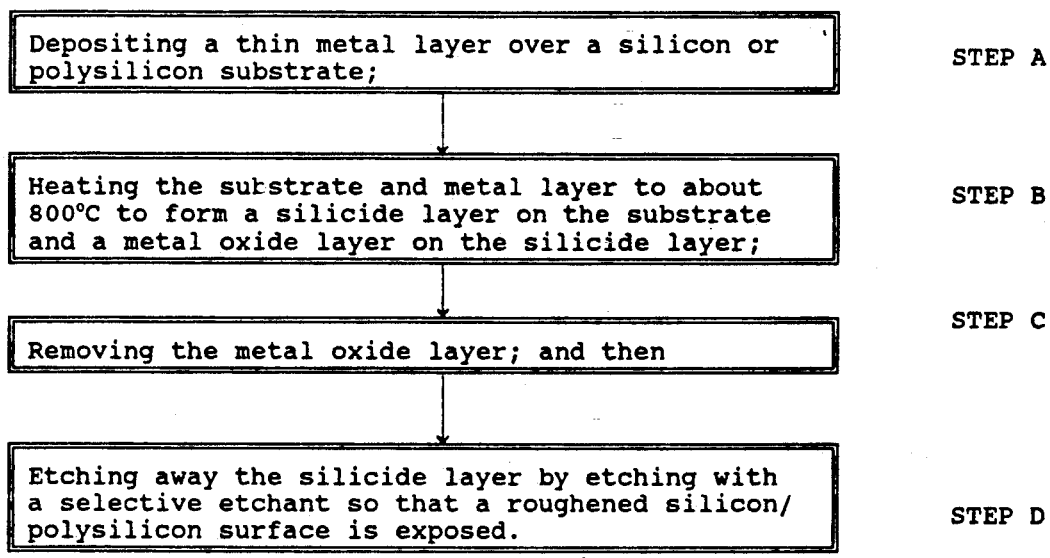
FIG. 1 is a flow diagram of the present invention.

With reference to FIG. 1, the method of the invention can be used on either a silicon substrate or after formation of a polycrystalline silicon (polysilicon) on a substrate. For purposes of explanation, the description will refer to a silicon/polysilicon substrate. An illustrative embodiment of the method of the invention, broadly stated, includes the steps of:

Step A—depositing a thin metal layer over a silicon or polysilicon substrate;

Step B—heating the substrate and metal layer to about 800° C. to form a silicide layer on the substrate and a thin metal oxide-nitride layer on the silicide layer;

Step C—removing the metal oxide/nitride layer; and

Step D—etching away the silicide layer by etching with a selective etchant so that a roughened silicon/polysilicon substrate surface is exposed.

In the following illustrative embodiment of the invention, the thin metal layer is formed of titanium. Alternately, other metals may be utilized in the practice of the invention.

With reference to FIG. 1, in an illustrative embodiment of Step A, a thin layer of titanium (Ti) of about 500 Angstrom (Å) (0.05 μm) is deposited on the silicon/polysilicon substrate surface to be roughened, by means such as sputtering, chemical vapor deposition (CVD), low pressure CVD, or vacuum evaporation. The resulting layer may be any thickness between about 50 Å and about 3000 Å. Titanium is characterized by the ability to withstand extremely high temperatures. It also reacts with silicon to form $TiSi_x$. Titanium is generally regarded as a refractory metal. Other metals and refractory metals, such as tungsten and tantalum, would also be suitable for this application.

Step B involves heating the silicon substrate and titanium layer to a temperature high enough to initiate a chemical reaction between the titanium and the silicon/polysilicon substrate in order to form a titanium silicon ($TiSi_x$), compound. This temperature is well below the melting point of titanium which is 1675° C. By way of example, the titanium and silicon/polysilicon substrate may be heated through to a temperature of about 800° C. This may be accomplished in a furnace or using a rapid thermal process (RTP) annealing device. This annealing process must be performed for a time period sufficient to heat the titanium metal layer and substrate through and initiate a reaction between the titanium and silicon/polysilicon for forming a titanium silicide ($TiSi_x$). Additionally, a thin layer of a metal oxide-nitride, such as $TiN_xO_y$, is formed above the TiSi layer, as a result of oxidation of the titanium layer during the annealing process. It is theorized that the roughness develops during this annealing process because of an uneven reaction between the silicon/polysilicon and titanium layer at locations on the silicon surface having native oxide (i.e., $SiCO_2$). Additionally, a further roughness develops as a result of a faster growth of $TiSi_x$ at the grain boundary of the titanium layer and silicon surface.

Figure 2:
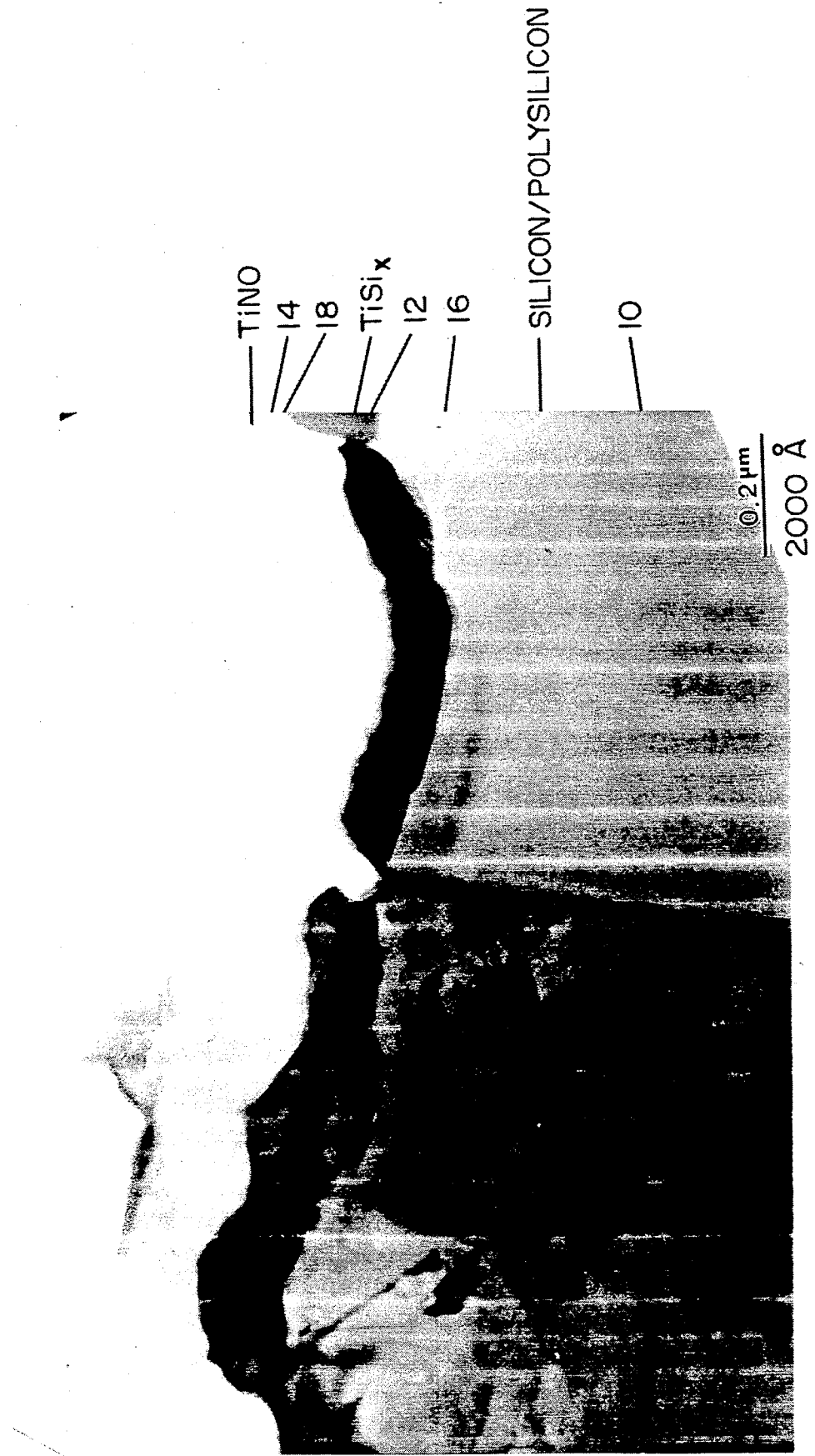
FIG. 2 is a microphotograph of a cross-section of a silicon substrate having a surface roughened in accordance with the invention.

The resultant roughened surface is clearly shown in the micrograph of FIG. 2. In FIG. 2, the polysilicon/silicon substrate is denoted by reference numeral 10. The titanium silicide ($TiSi_x$) layer is denoted by reference numeral 12. The titanium oxide-nitride ($TiN_xO_y$) layer is denoted by reference numeral 14. As is clearly shown, the grain boundary 16 at the silicon substrate 10 with the titanium silicide ($TiSi_x$) layer 12, as well as the grain boundary 18 of the titanium silicide ($TiSi_x$) 12 with the titanium oxide-nitride metal layer 14, are rough and irregular.

In an illustrative embodiment of Step C, the titanium oxide ($TiN_xO_y$) layer 14 is removed by exposure to a 1:1 solution of ammonium hydroxide ($NH_4OH$) and hydrogen peroxide ($H_2O_2$) for a period of time sufficient to etch away the titanium oxide-nitride ($TiN_xO_y$) layer 14. Other solutions may also be suitable for this application depending on the metal used.

In an illustrative embodiment of Step D, the layer of titanium silicide ($TiSi_x$) may be removed by an etching step utilizing an etchant selective to the titanium silicide ($TiSi_x$) 12. As an example, an HF acid dip may be used for removing the titanium silicide ($TiSi_x$) 12.

This leaves the surface of the silicon/polysilicon substrate 10 as rough and irregular with an increased surface area. The substrate 10 may then be processed in accordance with standard techniques for forming various semiconductor devices.

Thus, the invention provides a simple but unobvious method for providing a roughened silicon or polysilicon substrate for a semiconductor wafer or die. The method of the invention is an improvement over prior art roughening processes because: firstly, no particulate contaminants are formed; secondly, even if the substrate is thin and fragile, it is not damaged by the method; and thirdly, the electrical characteristics of the substrate are unaffected.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. In semiconductor manufacture a method for roughening a surface of a silicon or polysilicon substrate comprising:

depositing a metal layer on the substrate;

heating the substrate and metal layer in an atmosphere to initiate a chemical reaction between the metal layer and substrate to from a metal silicide layer on the substrate and to form a metal oxide-nitride layer on the metal silicide layer;

removing the metal oxide-nitride layer with an etchant; and then removing the metal silicide layer with a selective etchant, thereby exposing a roughened surface area on the substrate t a boundary of the substrate and metal silicide layer.

2. The method as recited in claim 1 wherein:

the metal layer is deposited to a thickness of between about 50 and about 3000 Angstrom (Å).

3. The method as recited in claim 2 and wherein:
the metal layer thickness is about 500 Å.

4. The method as recited in claim 1 and wherein:
the metal layer is a refractory metal.

5. The method as recited in claim 4 and wherein:
the metal layer is titanium (Ti).

6. The method as recited in claim 5 and wherein:
the metal silicide layer is titanium silicide ($TiSi_x$) and is removed by exposure to a hydrofluoric acid solution.

7. The method as recited in claim 6 and wherein:
the metal oxide-nitride layer is titanium oxide-nitride ($TiN_xO_y$) and is removed with a solution of ammonium hydroxide ($NH_4OH$) and hydrogen peroxide ($H_2O_2$).

8. In semiconductor manufacture a method for roughening a surface of a silicon or polysilicon substrate comprising:
depositing a titanium layer on the substrate;
heating the substrate and titanium layer in an atmosphere to a temperature for causing a chemical reaction that creates a titanium silicide ($TiSi_x$) layer on the substrate with a rough and irregular grain boundary and a titanium oxide-nitride ($TiN_xO_y$) layer on the titanium silicide ($TiSi_x$) layer; and then
removing the titanium oxide-nitride ($TiN_xO_y$) layer with an etchant and removing the titanium silicide ($TiSi_x$) layer with an etchant selective to titanium silicide ($TiSi_x$) thereby exposing a roughened surface area on the substrate at the boundary between the silicide, and silicon or polysilicon substrate.

9. The method as recited in claim 8 and wherein:
the titanium oxide-nitride ($TiN_xO_y$) layer is removed with a solution of ammonium hydroxide ($NH_4OH$) and hydrogen peroxide ($H_2O_2$).

10. The method as stated in claim 9 and wherein:
the titanium oxide-nitirde ($TiN_xO_y$) layer is removed by exposing the titanium oxide-nitride ($TiN_xO_y$) layer to a 1:1 solution of ammonium hydroxide and hydrogen peroxide.

11. The method as stated in claim 9 and wherein:
the titanium layer thickness is deposited to a thickness between about 50 and about 3000 Angstrom (Å).

12. The method as stated in claim 11 and wherein:
the titanium layer thickness is about 500 Å.

13. The method as stated in claim 8 and wherein:
the titanium silicide ($TiSi_x$) layer is removed by exposing the titanium silicide ($TiSi_x$) to a hydrofluoric acid solution.

* * * * *

UNITED STATES PATENT AND TRADEMARK OFFICE
CERTIFICATE OF CORRECTION

PATENT NO. : 5,223,081

DATED : June 29, 1993

INVENTOR(S) : Trung T. Doan

It is certified that error appears in the above-identified patent and that said Letters Patent is hereby corrected as shown below:

Title page:   Assignee should be identified as --Micron Technology, Inc., Boise, ID.--

Attorney, Agent or Firm should be identified as --Stephen A. Gratton--.

In claim 1, col. 4 line 59,
"from" should be --form--;

col. 4, line 66,
"t" should be --at--.

Signed and Sealed this

Twenty-ninth Day of March, 1994

Attest:

BRUCE LEHMAN

*Attesting Officer*          *Commissioner of Patents and Trademarks*